(12) United States Patent
Pettus et al.

(10) Patent No.: US 8,422,414 B2
(45) Date of Patent: *Apr. 16, 2013

(54) SYSTEM AND METHOD FOR WIRELESS COMMUNICATION IN A BACKPLANE FABRIC ARCHITECTURE

(75) Inventors: Michael Gregory Pettus, Dana Point, CA (US); James Robert Amos Bardeen, Los Angeles, CA (US)

(73) Assignee: Vubiq Incorporated, Aptos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/084,964

(22) Filed: Apr. 12, 2011

(65) Prior Publication Data

US 2011/0188417 A1  Aug. 4, 2011

Related U.S. Application Data

(63) Continuation of application No. 12/214,985, filed on Jun. 23, 2008, now Pat. No. 7,929,474.

(60) Provisional application No. 60/936,951, filed on Jun. 22, 2007.

(51) Int. Cl.
*H04B 7/00* (2006.01)

(52) U.S. Cl.
USPC .......................... 370/310; 455/41.2; 361/788

(58) Field of Classification Search .............. 370/310; 455/41.2; 361/788
See application file for complete search history.

(56) References Cited

U.S. PATENT DOCUMENTS

| | | | | |
|---|---|---|---|---|
| 4,939,726 A | * | 7/1990 | Flammer et al. | 370/400 |
| 5,007,052 A | * | 4/1991 | Flammer | 370/389 |
| 5,079,768 A | * | 1/1992 | Flammer | 370/349 |
| 5,115,433 A | * | 5/1992 | Baran et al. | 370/400 |
| 5,130,987 A | * | 7/1992 | Flammer | 370/436 |
| 5,276,345 A | * | 1/1994 | Siegel et al. | 257/352 |
| 5,347,287 A | * | 9/1994 | Speciale | 342/375 |
| 5,465,398 A | * | 11/1995 | Flammer | 455/69 |
| 5,479,400 A | * | 12/1995 | Dilworth et al. | 370/331 |
| 5,488,608 A | * | 1/1996 | Flammer, III | 370/400 |
| 5,515,369 A | * | 5/1996 | Flammer et al. | 370/480 |
| 5,570,084 A | * | 10/1996 | Ritter et al. | 370/338 |
| 5,754,948 A | * | 5/1998 | Metze | 455/41.2 |
| 5,903,239 A | * | 5/1999 | Takahashi et al. | 343/700 MS |
| 5,903,566 A | * | 5/1999 | Flammer, III | 370/406 |
| 6,600,428 B1 | | 7/2003 | O'Toole | |
| 6,696,879 B1 | | 2/2004 | O'Toole | |
| 6,721,289 B1 | | 4/2004 | O'Toole | |
| 6,735,183 B2 | | 5/2004 | O'Toole | |
| 6,836,472 B2 | | 12/2004 | O'Toole | |
| 6,891,391 B2 | | 5/2005 | Hiroki | |
| RE40,253 E | | 4/2008 | Kim | |
| 7,373,107 B1 | * | 5/2008 | Wesolowski | 455/41.2 |
| RE40,385 E | | 6/2008 | Bang | |
| 2007/0229182 A1 | | 10/2007 | Gaucher | |
| 2008/0218413 A1 | * | 9/2008 | Li et al. | 342/367 |

* cited by examiner

*Primary Examiner* — Min Jung
(74) *Attorney, Agent, or Firm* — LeClairRyan, A Professional Corporation

(57) ABSTRACT

A wireless millimeter wave backplane network and method comprises a first circuit board that has a first module thereon, wherein the first circuit board is coupled to a high speed backplane. The network includes a first communication node that is coupled to the first module and which is disposed on the first circuit board. The network includes a second circuit board that has a second module thereon, wherein the second circuit board is coupled to the high speed backplane. The network includes a second communication node that is coupled to the second module and disposed on the second circuit board, wherein the first and second modules wirelessly communicate using millimeter wave electromagnetic radiation with one another via the first and second communication nodes.

16 Claims, 4 Drawing Sheets

SYSTEM AND METHOD FOR WIRELESS COMMUNICATION IN A BACKPLANE FABRIC ARCHITECTURE

STATEMENT OF RELATED APPLICATIONS

The present application is a continuation of co-pending U.S. patent application Ser. No. 12/214,985 filed Jun. 23, 2008, which claims priority to U.S. Provisional Patent Application Ser. No. 60/936,951, filed on Jun. 22, 2007, all commonly owned herewith.

TECHNICAL FIELD

The present disclosure relates generally to a system and method for wireless communication in a backplane fabric architecture.

BACKGROUND

In enterprise computer and networking systems, it is often advantageous to utilize high-density computer processing, data storage and telecommunication hardware components for the processing, storage, switching, routing and transport of high speed data in the form of digital signals. It is also advantageous for a plurality of these various components to communicate with each other at very high speed signaling rates. The use of a component-based system having separation of functions such as processing, storage, switching, and input/output interfaces allows individual components to be updated or upgraded independently from other components as well as allows customization for specific tasks. Furthermore, the use of components is cost effective since developing or purchasing a new component is less expensive than developing or purchasing an entirely new integrated hardware system that is not based on component design. However, such existing systems are hardwired and use a central switching architecture to allow components to communicate with one another.

What is needed is a system and method for high speed signaling in a backplane fabric that is not limited by fixed physical media and/or a centralized switching architecture.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

OVERVIEW

Figure 1:
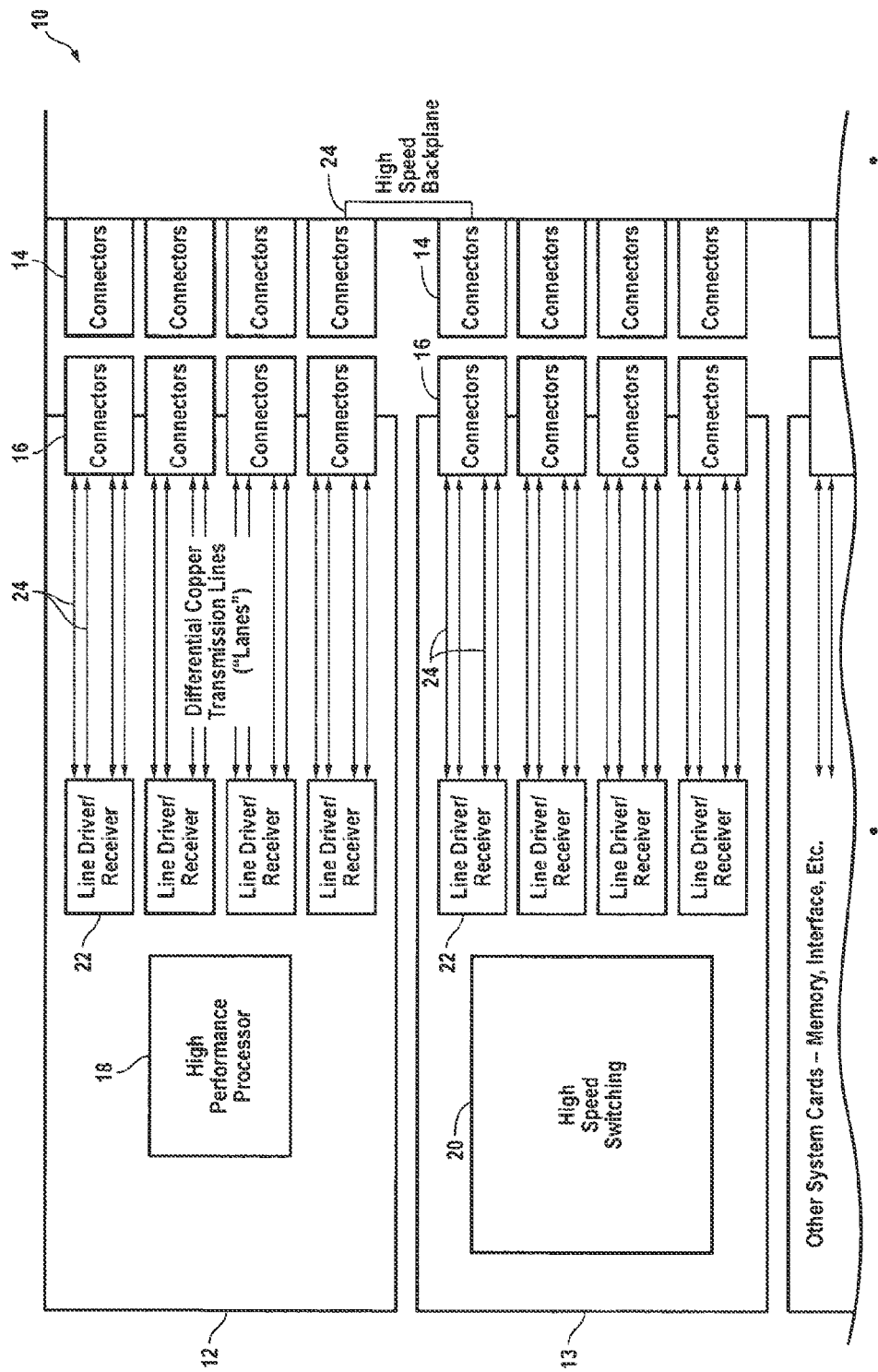
FIG. 1 illustrates an existing high speed hard wired backplane.

In one aspect, a wireless millimeter wave backplane network comprises a first circuit board that has a first module thereon, wherein the first circuit board is coupled to a high speed backplane. The network includes a first communication node that is coupled to the first module and which is disposed on the first circuit board. The network includes a second circuit board that has a second module thereon, wherein the second circuit board is coupled to the high speed backplane. The network includes a second communication node that is coupled to the second module and disposed on the second circuit board, wherein the first and second modules wirelessly communicate using millimeter wave electromagnetic radiation with one another via the first and second communication nodes.

In an aspect, a method for wirelessly communicating between a plurality of modules in a high speed backplane fabric. The method comprises selecting a destination communication node to receive a data packet. The destination communication node has at least a receiving antenna and is coupled to a first circuit board, wherein the first circuit board is coupled to a high speed backplane. The method includes wirelessly transmitting the data packet using millimeter waves from a source communication node via a transmitting antenna to the destination communication node. The source communication node is coupled to a second circuit board, wherein the second circuit board is coupled to the high speed backplane.

In an aspect, a wireless backplane fabric network comprises a first circuit board which has a first module thereon and a first communication node that is coupled to the first module and disposed on the first circuit board. The network includes a second circuit board that has a second module thereon and a second communication node that is coupled to the second module and disposed on the second circuit board. The network includes a third circuit board that has a third module thereon and a third communication node that is coupled to the second module and disposed on the third circuit board. In the network, the first, second and third modules wirelessly autonomously select and communicate within one another via at least two of the first, second and third communication nodes without using a central switching module.

In an aspect, a system for wirelessly communicating between a plurality of modules disposed on one or more circuit boards. The system comprises means for selecting a destination transceiver node to receive a data packet from a first module on a first circuit, the destination transceiver node having a receiving antenna; and means for wirelessly transmitting the data packet via a millimeter wave signal from a source transceiver node to the destination transceiver node, the source transceiver node autonomously selects the destination transceiver module and transmits thereto without using a central switching module.

In any or all of the above aspects, the communication node further comprises a first substrate having a first surface and a second surface, whereby the second surface is configured to interface the chip package to a circuit board that is made of a first dielectric material. The node includes a second substrate which is disposed on the first surface of the first substrate, wherein the second substrate is made of a second dielectric material. A communication element is disposed on the second substrate, wherein the communication element includes an antenna and a communication device coupled to the antenna. A lid is coupled to the first substrate and is configured to encapsulate the communication element. The lid has a lens which is configured to allow radiation from the antenna to be emitted therethrough. The communication element can further includes a plurality of transmitters coupled to respective transmitting antennas, wherein the transmitters and transmitting antennas are all disposed on the second substrate. The communication element also include a plurality of receivers coupled to respective receiving antennas, wherein the receivers and receiving antennas are all disposed on the second substrate. In an embodiment, a data source is disposed on the first circuit board and is coupled to the first communication node, wherein the data source provides at least operational information to the first communication node. It is preferred that the first communication node and the second communication node wirelessly communicate to perform a switching function between the first and second modules without using a central switch. It is contemplated that the communication nodes utilize time division multiplexing access and/or frequency division multiplexing access. In the network, a intermediate communication node which has a transmitter antenna and a receiver antenna receives communication from the first communication transmits the data packet to the second communication node. In communicating with one another, the nodes identify an operating parameter for the data packet, wherein the operating parameter at least includes an address of the destination node. The operating parameter may include a frequency hopping sequence, a time counter for the frequency hopping sequence, information identifying a node other than the destination node which is capable of receiving the data packet, a selected power setting and/or a selected sensitivity setting to allow successful transmission of the data packet. In any or all of the above embodiment, the communication nodes are configured to and capable of communicating using MIMO technology.

DESCRIPTION OF EXAMPLE EMBODIMENTS

Example embodiments are described herein in the context of a system and method for wireless communication in a backplane fabric architecture. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. It is understood that the phrase "an embodiment" encompasses more than one embodiment and is thus not limited to only one embodiment. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

Existing structures for housing high speed digital components, such as servers, have rack-mountable cabinets with internal printed circuit cards or blade slots, also referred to herein as "blades". The blades carry multiple integrated circuits and other supporting circuitry and are plugged into a backplane printed circuit board that provides a set of interconnection pathways or lanes between the blade slots. Existing methods for interconnection of the high speed digital components (e.g. blades, backplanes and cabinets) or modules (e.g. integrated circuits, memory storage, processors, interfaces) rely on copper printed circuit traces and/or copper or fiber optic cabling. The copper or fiber is the physical medium used to transport electrical or optical signals. The total number of interconnects and lanes within a given system is fixed, and extensibility is limited by the fixed nature of the physical media.

Since the components are randomly interconnected to each other on an as-needed basis to allow for flexible component to component communications, the lanes and/or cables are typically routed to a centralized switching blade or switching cabinet. If a given originating component needs to communicate with any other component in the system, it must be interconnected with the centralized switching module so that the centralized switching module can switch and direct the originating component signals to the desired destination component. The centralized switching module has a fixed number of input and output connections and represents another fixed resource in the system that limits ultimate capacity and extensibility of a component based system.

It should be noted that the physical implementation of a system of computers, servers and software can be within a single blade, or within a cabinet (with multiple blades); as a group of multiple cabinets within a rack; and/or as a group of racks within a larger space such as in a data center. The architecture of requiring a centralized switching module is the same regardless of the scale of the system; whether switching between components on a single blade; between blades via a backplane; between cabinets via cables to a switching unit; or between racks via cables within a data center. The concept of a switched "fabric" broadly encompasses the switched functionality independently of the physical size or of the switching architecture of the system.

FIG. 1 illustrates the traditional high speed hard-wired blade system. As shown in FIG. 1, the blade system includes one or more backplanes 10 having several connectors 14 as well as one or more printed circuit board blades 12, 13 each having several connectors 16 whereby the blades 12, 13 are coupled to the backplane 10 via the connectors 14, 16. In the embodiment shown in FIG. 1, the blade 13 has a processor 18 and the blade 12 has a high speed central switch 20. Additionally, other system blades having circuit modules that are not shown (e.g. memory, interfaces, processors) are contemplated to be connected to the backplane via corresponding connectors. In addition, each blade 12, 13 includes several line drivers/receivers 22 which are hardwired to the connectors, whereby signals are routed between the blades 12, 13 and the backplane. In particular, the processor 18 and the central switch 20 in the blades 12, 13 each are shown to include four line drivers/receivers 22 which are connected to their respective blade connectors 16 using differential copper transmission lines 24. Additionally, the backplane 10 is hardwired between connectors 14 to allow signals to travel between the processor blade 12 and the central switch blade 13 as well as other modules in other blades. Note that the physical placement of the backplane relative to the blades may be at one end or between sets of blades in the middle of an enclosure (known as a midplane).

The existing configuration in FIG. 1 has many disadvantages. Signals from one module to another must travel through the hardwire lines 24 in the blades 12, 13 as well as the backplane 10 and through the connectors 14, 16 between the blades 12, 13 and the backplane 10. Additionally, all inter-blade communications must travel to the central switch 20 to be properly routed to the destination module. This translates into a substantially complex fabric having latency and delay issues. The capacity of existing hard-wired backplane systems is also limited by the physical layout and number of wired physical interconnects between elements in the system. Once the existing number of interconnects, or lanes is used, the data communications capacity of the system is limited. Adding additional elements within the system is impossible without re-design of the entire backplane and interconnect structure. Further, the cost in manufacturing the blades and the backplane as well as the connectors and copper transmission lines can become very expensive.

To overcome these disadvantages and limitations, the novel system described utilizes a plurality of wireless transceiver modules, also referred to as nodes, preferably disposed on printed circuit boards. Each node has autonomous intelligent routing and switching capability to allow the nodes to communicate with one another wirelessly without the use of expensive interconnects or copper tracing. The resulting tightly coupled mesh network of transceiver modules provides a less expensive solution which utilizes less power than centralized and hard-wired backplane systems.

Figure 2:
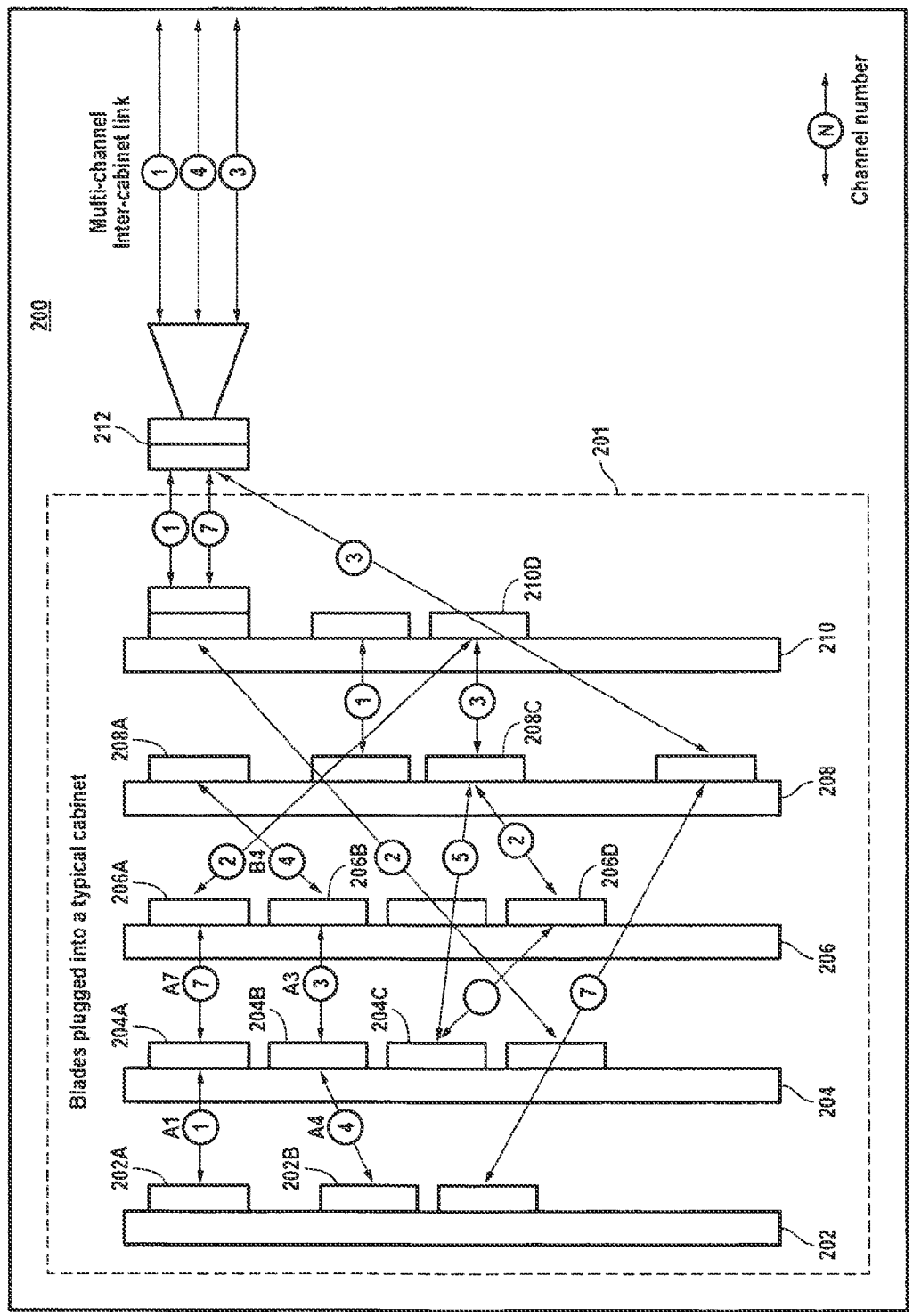
FIG. 2 illustrates a wireless backplane fabric system in accordance with an embodiment.

FIG. 2 illustrates a wireless backplane fabric system in accordance with an embodiment. As shown in FIG. 2, several printed circuit board blades are placed in a common cabinet or in different cabinets, whereby the blades communicate with one another using wireless nodes. Each node is coupled to a power source as well as the module(s) that the node serves (e.g. processor, memory, interface, etc.). In particular to the embodiment in FIG. 2, blade 202 includes three nodes 202A, 202B, 202C; blade 204 includes four nodes 204A, 204B, 204C, and 204D; blade 206 includes four nodes 206A, 206B, 206C and 206D; blade 208 includes four nodes 208A, 208B, 208C and 208D; and blade 210 includes four nodes 210A and 206B stacked on one another, 210C and 210D. It should be noted that any number of blades, including only one, are contemplated and each cabinet may have one or more blades disposed thereon. It should be noted that any number of nodes may be configured on the blades, including only one node, and the number of nodes on the blades are only exemplary in FIG. 2. Although the nodes are shown on one side of the blades, it is contemplated that the nodes may be disposed on the other side of the blade or both sides of the blades. It should also be noted that it is not necessary that the nodes even be disposed on a blade. For instance, the nodes may be integrated into one or more modules such as a memory, processor, interface, etc., whereby the module itself is mounted on the printed circuit board blade. It should be noted that although the nodes are primarily discussed in relation to be mounted onto to blades in a backplane fabric application, the nodes may be used in a more general sense in which two or more modules, for example a processor and a memory physically separate from one other may exchange data wirelessly using the nodes described herein.

As shown in the embodiment in FIG. 2, one or more nodes may be positioned externally to the cabinet structure 201 to allow wireless signaling between blades in physically separate cabinets. For example, a node 212 may be placed externally to the cabinet structure 201 such that the location is optimized for wireless connectivity to nodes within the cabinet and/or nodes in other cabinets. This provides the ability for the system 200 to extend the mesh network beyond the internal cabinet space and thus extend the system 200 to serve as a backplane to other cabinets of an entire data center fabric. The extensibility of the described system 200 utilizes network capacity as a function of spectrum bandwidth and modulation efficiency with effectively no limit set by the physical interconnects, central switches, cables or number of physical conducting lanes as in hard-wired systems. It should be noted that although it is described that the inter-cabinet communicating node is external to its cabinet, it is contemplated that the node may be included within the cabinet or disposed on a blade within the cabinet. The inter-cabinet communicating node would be configured to have a higher power and sensitivity setting and/or a dedicated time slot and/or channel to allow signals to be sent without interfering with the mesh network within that node's own cabinet.

As will be discussed, the nodes are wireless transceivers programmed to selectively communicate with other nodes to relay data signals in the millimeter wave frequency range therebetween and/or among blades without the need of using connectors, a central switching module, hardwires or fixed backplane architectures. Each node is thus wirelessly coupled to other modules on the blade and operate to dynamically and automatically determine and select when and where to send signals along with the predetermined frequency channel, time slot, transmission power level, receiving sensitivity level and/or other parameters based on sensing of the network's spectral, data, and power conditions. Each node effectively is an autonomous switch, thereby providing each blade with its own set of switches. This is in marked contrast to existing backplanes which use a central switch shared among a plurality of blades.

Figure 3:
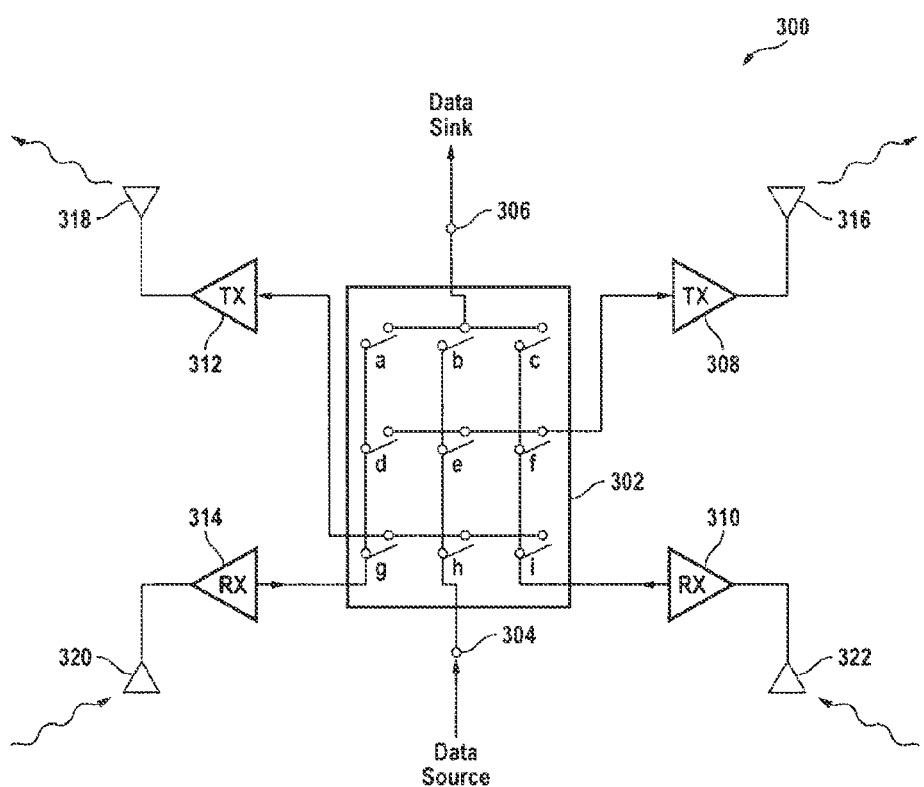
FIG. 3 illustrates a circuit schematic of a wireless transceiver node in accordance with an embodiment.

FIG. 3 illustrates a schematic of the node in accordance with an embodiment. In an embodiment, the node 300 preferably includes one or more transmitter communication elements which includes a corresponding transmitter circuit and antenna, one or more receiver communication elements which includes a corresponding receiver circuit and antenna. In the embodiment in FIG. 3, the node 300 includes two sets of transmitter communication elements, namely a first set having transmitter 308 coupled to antenna 316 as well as a second set having transmitter 312 coupled to antenna 318. In the embodiment in FIG. 3, the node 300 includes two sets of receiver communication elements, namely a first set having receiver 314 coupled to antenna 320 as well as a second set having receiver 310 coupled to antenna 322. The transmitters 308, 312 and receivers 310, 314 serve to modulate, power and control the signal which is correspondingly transmitted or received via their respective antennas. In an embodiment, the transmitters 308, 312 and receivers 310, 314 are configured to have multiple-in, multiple-out (MIMO) or other smart antenna capabilities to allow increased spectral efficiency, link reliability and/or diversity, such as reduced fading.

In addition, the node 300 includes data switching and routing circuitry, and embedded software (firmware) that controls the node's functionality. In particular, the embodiment in FIG. 3 includes a circuit 304 connected via hardwire to the data source such as a module or another node; and a circuit 306 connected via hardware to the data sink such as a module or another node. In an embodiment, the data sink and data source may be the same module (e.g. a memory from and to which data is stored and accessed). Node 300 also includes a switching circuit 302 which is composed of individual switches 302(a) through 302(i) (all shown in FIG. 3 as being open), each of which can be independently controllable. It should be noted that although nine individual switches 302(a) through 302(i) are shown in the embodiment in FIG. 3, the embodiment is a non-limiting example and any number of switches are contemplated.

The transmitter antennas 316 and 318 are connected to the transmitter circuits 308 and 312 respectively. The inputs to the switching circuit 302 are connected to data source 304, receiver 310 and receiver 314. The outputs from the switching circuit 302 are preferably connected to data sink 306, transmitter 308 and transmitter 312. It is preferred that each individual switch 302(a) through 302(b) in switching circuit 302 can independently connect any input circuit to any output circuit.

Node 300 can be configured for various network switching modalities, some non-limiting examples being: a receiver connected to the local data sink; a receiver connected to a transmitter for wireless repeating functionality; a receiver connected to a transmitter and a second receiver connected to a second transmitter for multiple repeating functionality; and/or a receiver connected to both the local data sink and to one or more transmitters for simultaneous repeating functionality.

An example would be a wireless signal to local data sink function, whereby the receiver 310 receives a wireless signal via antenna 322 and connects to data sink circuitry 306 via closed switch 302(c). An example would be the node 300 wirelessly receiving data and storing the data in a memory, whereby the memory is represented as the data sink. Additionally or alternatively, the additional repeating function can be enabled by connecting the same signal from receiver 310 to transmitter 308 via closed switch 302(f). If only the repeating function from receiver 310 to transmitter 308 is desired, then switch 302(c) can remain open while switch 302(f) is maintained in the closed position. An example of providing dual simultaneous wireless repeating functionality would be to connect receiver 310 to transmitter 308 via switch 302(f) and also connecting receiver 314 to transmitter 312 via closed switch 302(g).

Another operation of the node 300 would be for a multicast function in which multiple receivers and/or transmitters would be operating simultaneously, such as for operation using multiple-in, multiple-out (MIMO) technology. In an example of the multicast function, receiver 310 would be connected to transmitters 312 and 308 through closed switches 302(i) and 302(f). Similarly, receiver 314 would be connected to transmitters 312 and 308 through closed switches 302(g) and 302(d). Additionally or alternatively, data source 304 would be connected to transmitters 312 and 308 through closed switches 302(h) and 302(e). Note that the relative size in dimension of the switching circuitry 302 is much smaller than a typical centralized large system switch. The smaller dimension and size of the node yields lower propagation delay, lower power required and active switching functionality that is only used on an as-needed basis across the system of wireless mesh nodes in the proposed embodiment.

It should be noted that the circuit shown in FIG. 3 is an example of the node, and it will be appreciated that circuit configuration as well as the number of antennas, transmitters, receivers, data sinks and data sources may vary depending on the application of the node. In an embodiment, the transmitter and receiver antennas are in an opposed configuration as shown in FIG. 3. This configuration shown in FIG. 3 allows the transmitting antenna 316 and the receiving antenna 322 to communicate with wireless signals on the one side of the node whereas the transmitting antenna 318 and the receiving antenna 320 are able to communicate with wireless signals on the opposite side of the node in a symmetrical manner. Although the configuration of the opposed transmitting and receiving antennas are preferred, it is contemplated that a non-symmetrical antenna configuration can be implemented. It should be noted that although the circuit described herein has a particular configuration, it should be noted that other configurations are contemplated and are not limited to the example circuit.

In an embodiment, the node 300 operates in a half duplex mode in which the node 300 either transmits or receives data, whereby the node does not receive data during transmission and does not transmit data while receiving data. In an embodiment, the node 300 operates in a full duplex mode in which the node 300 simultaneously transmits and receives data via its respective antennas. It should also be noted that although the node 300 is described as including one or more transmitter and receiver antennas, it is contemplated that the node 300 may alternatively have only transmitting or receiving capabilities.

The transceiver node 300 is able to perform a variety of functions to allow effective communication between modules, blades and/or cabinets. The node 300 is able to receive data from a data source 304, such as a local connection on the plane, and transmit the data or a portion of the data wirelessly via either or both of the transmitter antennas 316, 318. In an embodiment, the data source 304 may be connected to the node by a hard wire, although the node may receive signals from the data source 304 wirelessly. The node 300 is also capable of receiving data from the data source 304 and transmitting the data to the data sink 306. Additionally, the node 300 is capable of performing repeating functionality in which the node 300 receives data wirelessly from either or both receiver antennas 320, 322 and transmits the data (or a portion thereof) to either or both of the transmitter antennas 316, 318, thereby acting as an intermediate node between the source and destination nodes. Additionally or alternatively, the node is able send the received data (or a portion thereof) to the data sink 306. The switches are logic based in an embodiment, although operation of the switches may be software based. In an embodiment, each transceiver node 300 can arbitrarily select a millimeter wave frequency channel of selectable channel spectrum width for transmission and reception independently from a set of frequency channels within a given millimeter wave band.

The data source 304 may additionally or alternatively provide data to instruct the node 300 to execute a particular operation. For example, the operational instructions received by the node 300 may indicate the address of the destination node and/or intermediate nodes, the level of power which will be attenuated by the transmitter, the time slot in which the signal will be communicated, the desired channel of the signal, the frequency at which the signal will be communicated, and/or the data rate of transmission and/or sensitivity at which the receiver must be at to properly receive the signal. In an embodiment, the operational instructions or a portion thereof may be included in the signal wirelessly received by antenna(s) 320, 322, whereby such instructions are solely used or combined with incoming instructions via the data source 304 to instruct the node 300 of its operation.

Referring back to FIG. 2, each node is able to receive operational instructions and communicate data signals with conjunction with those operational instructions to effectively operate as a backplane fabric. The arrows shown in FIG. 2 represent data communication between two or more respective nodes, whereby the communication is in the form of wireless electromagnetic radiation or RF signals preferably in the millimeter wavelength range. Node 202A in FIG. 2 is shown by arrow A1 communicating data signals with node 204A at time slot A on channel 1. At substantially the same time, node 204A is capable of communicating data signals with node 206A at time slot A but on channel 7 (arrow A7), and node 202B is communicating with node 204B at time slot A on channel 4 (arrow A4). This frequency division multiplexing access (FDMA) allows the nodes to communicate in the same time slot at different frequencies. In a different time slot B, node 206B communicates with node 208A using channel 4, shown as arrow B4, (the same channel between 202B and 204B) without interfering with the signal transfer between 202B and 204B. The system thus can utilize time divisional multiplexing access (TDMA) to allow the nodes to communicate on the same frequency channel at different time slots. In an embodiment, the system uses FDMA with TDMA as a spectrum access technique. When a transmitter and receiver coordinate on a specific sequence of frequency changes in time, the technique is known as frequency hopping spread spectrum (FHSS). Spread spectrum techniques mitigate co-channel interference in tightly coupled electromagnetic environments and allow multiple transceiver network nodes to simultaneously communicate by using different frequency hopping sequences. Other autonomous routing, control, modulation and access parameters are contemplated for use by the system which include but are not limited to: sensed propagation channel conditions, modulation index selection, transmit power level selection, receive sensitivity level selection, and antenna beam heading selection.

In an embodiment, the system 200 is able to adjust the gain and sensitivity of one or more of the nodes to allow signal transfer at the same time and/or frequency channel of a communication between other nodes without interfering with that communication. As shown in FIG. 2, node 204B and 206B are shown communicating at time slot A on frequency channel 3 (arrow A3) while nodes 208C and 210D are communicating at the same time slot and frequency. The two sets of nodes do not interfere with one another precisely because nodes 204B and 206B have their respective gains/sensitivities adjusted at a level low enough such that the signal does not interfere with the signals between nodes 208C and 210D and vice versa. In an embodiment, the nodes are precisely controlled to allow them to efficiently and effectively communicate with one another without generating interference by selectively using different channels, time slots and utilizing power and/or sensitivity levels.

In an embodiment, multiple transmitters and receivers operating simultaneously may be selected either from within a single transceiver module or among several modules for improved spectral efficiencies using space-time coding parameter selection (as used in multiple input multiple output "MIMO" systems). The environment for the use of the described system is within cabinet structures and between cabinets in a data or computing center. The interior of a cabinet contains multiple cards or blades and typically has electromagnetic environments with highly reflective surfaces and propagation paths that will randomly vary from line-of-sight to highly scattered. In an embodiment the system has the ability to control transmit power, receive sensitivity, channel frequency, antenna beam heading with the additional parameter controls of modulation efficiency, MIMO space-time coding, and spacial multiplexing takes advantage of such an environment. By using millimeter wave frequencies (typically 60 GHz and higher) with wavelengths on the order of a few millimeters in conjunction with variable parameter control, the system is able to control communications distances between nodes to within a few centimeters.

In an embodiment, the nodes communicate at 60 GHz and in particular, the 57-64 GHz range. In an embodiment, the nodes communicate at the 120 GHz and/or the 240 GHz range. However, in the present application, 57-64 GHz frequency range is used in describing the system. Of course, it should be noted that the system is able to operate effectively at other frequencies and in other frequency ranges and is thus not limited to the above values.

During operation, the nodes are able to communicate with one another in which one or more source nodes by selecting a destination node to receive a data packet. The transmitting or source node then wirelessly transmits, preferably using millimeter waves, the data packets to the destination node directly or through an intermediate node. The source node is preferably programmed to have a predetermined selected power setting and the destination node is programmed to have a predetermined selected sensitivity setting to allow successful transmission of the data packet between the nodes.

In particular, each node identifies its operating parameters or profile each time it sends a data packet to one or more destination nodes, whereby the operating parameter or profile is attached to the data packet. The operating parameters include, but are not limited to, its address, its frequency hopping sequence, and its time counter within the sequence. In an embodiment, a packet oriented protocol is used to provide a transport mechanism that contains both data payload and network overhead information, along with standard packet information such as start, length, addresses, cyclic redundancy check (CRC), etc. The network overhead information includes operational information needed by the nodes for communicating their internal parameters. In-place wireless standards (such as IEEE 802.11, 802.11n, 802.15 and/or 802.16) may be used to form the basis of the medium access control (MAC) layer with additions for the specialized physical layer requirements in a closely-spaced, millimeter wave mesh network using a frequency hopping protocol. One particular protocol, although only an example, may be:

[(start of packet, length, pads)-(source and destination addresses)- (network overhead)-(data xxxxxxxxxxxxx payload)-(cyclic redundancy check)-(end of packet)]

In an embodiment, along with each transmission, each node provides the profile information pertaining to one or more of the other nodes which are in proximity and/or are of interest to the transmitting node ("neighboring node"). Such information may include addresses, frequency hopping sequences, and time counters of the other nodes. In addition, the information may include information of the neighboring nodes to inform the receiving node of the quality of link with those neighboring nodes. For example, the quality of link information may indicate that a neighboring node has often dropped or timed-out on receiving a signal or sending an acknowledgment/acknowledgement-acknowledgement signal. In another instance, the quality of link may indicate that there is significant cross-talk interference due to the positioning of the neighboring node with respect to other components, etc. Once the receiving node receives the profile information, it stores the information in a memory and supplies it to the desired receiving nodes during its next transmission. It should be noted that the above is also preferably supplied with every acknowledgement and acknowledgement-acknowledgement signal in an embodiment. Such profile information is supplied in each transmitting signal to ensure that the receiving node or nodes are always updated with the status of other nodes in the system. In other words, the system will constantly be updated with node profile information at any instantaneous point.

With each node constantly knowing the status of other nodes in the system, the system functions as a "smart" switching system by utilizing each node to be able to quickly and efficiently transmit data to another node automatically without the need of a central switching module. For example, referring back to FIG. 2, node 204C, by knowing the profile of the node 208C (either directly from node 208C or its neighbors) is able to directly transmit data wirelessly to node 208C. In doing so, the node 204C inserts the destination address of node 208C in the data packet, along with node 204C's current profile with the other desired or necessary data, and transmits the packet to node 208C. The signal is transmitted on the frequency channel which corresponds to one of the frequencies being used by node 208C to receive data and is transmitted once, a predetermined amount of times, or continuously until the receiving node 208C receives the signal. Upon receiving the signal from node 204C, node 208 immediately sends an acknowledgement signal back to node 204C on the same frequency channel or on another frequency channel. In an embodiment, the node 204C, upon receiving the acknowledgement transmits an acknowledgement-acknowledgement back to node 208C. As stated above, the acknowledgement and/or acknowledgement-acknowledgement signals may include profile information included therein to update the system which the system may store in memory. Precise control of these parameters preferably through the use of firmware operating on high speed digital circuitry is implemented in each node and operates independently without requiring a central controlling function. Since any node can communicate with any other node in the system, no central switching facility is required. Switching takes place at each node in the mesh network, hence the switching is completely distributed.

In another example, node 204C may be informed (through node 208C or another node) that node 208C has adjusted its sensitivity to only be able to receive signals from nodes immediately next to node 208C or some other distance which prevents node 204C from directly communicating with node 208C. In this example, node 204C would transmit its signal which had an ultimate destination address of node 208C but has an intermediate address of node 206D. Node 204C would thereby transmit its packet to node 206D (or any other chosen node), whereby node 206D upon receiving the packet will process the ultimate destination address and send the packet to node 208C. In addition, in acknowledging the packet to node 204C, node 206D may send two separate acknowledgements (one for receiving the packet from the source and one for receiving the acknowledgement from the destination) separately or together.

In an embodiment, the system is able track, store and/or analyze all communications between nodes to improve operation of the overall mesh network. In an example, the system tracks, stores and/or analyzes the number of successful and unsuccessful connections between nodes. Additionally or alternatively, the system can track and store the number of interference event, timeouts, signal drops or other network related issues between nodes to provide a statistical analysis or history to allow the system to improve communications between nodes. This information may also be analyzed by an administrator or designer to improve the operation of the nodes within the network. For example, the system may analyze tracked information indicating that node 202A commonly drops signals with node 204A when node 204A acts as an intermediate node between node 202A and any other node. In the example, the system uses this information to instruct the node 204A (and all the other nodes) to no longer act as an intermediary for node 202A. In an embodiment, the system can use the tracked information as a diagnostic tool for a developer in improving the system.

The system is scalable in that the system can handle a change in the number of nodes (e.g. increased or decreased in number) and immediately begin communicating and transferring data with the existing nodes in the system. The registration process of a new node will now be discussed. In an embodiment, upon a new node coming online, the node proceeds to an acquiring mode in which it is assigned a random frequency hopping scheme as well as a random time counter scheme within the frequency hopping scheme. Upon being assigned its operating protocol, the node transmits an announcement signal to one or more other nodes by running through its assigned frequency scheme, whereby the announcement signal includes the node's operating profile. Upon the other nodes receiving the announcement signal, the receiving nodes transmit an acknowledgement signal back to the new node, whereby the acknowledgment signal confirms receipt of the announcement signal and provides that node's own profile as well as profiles of one or more other nodes in the system. Upon receiving the acknowledgement signals from the other nodes, the new node stores this information and is able to communicate with the other nodes immediately.

In an embodiment, the node may be configured to serve as an interface module as an addition or substitute to Bluetooth, USB, firewire, infrared, etc., to allow communication with an external device. In an example, an interface node may be configured in a laptop computer whereby the laptop interface node can sense, configure and automatically begin wirelessly communicating with a mobile phone, PDA, media player or other electronic device also having a transceiver node as that described herein. The system and method described herein can be used on various interfaces and existing fabrics for different market sectors such as Ethernet, Myrinet, Infiniband, etc. The system may be used to communicate between two electronic devices which traditionally use wires or cables (e.g. television and video equipment, audio receiver and remote speakers). The system may also be used to allow data communication between components within a single housing (e.g. between processor and memory in a high definition video camera).

Figure 4:
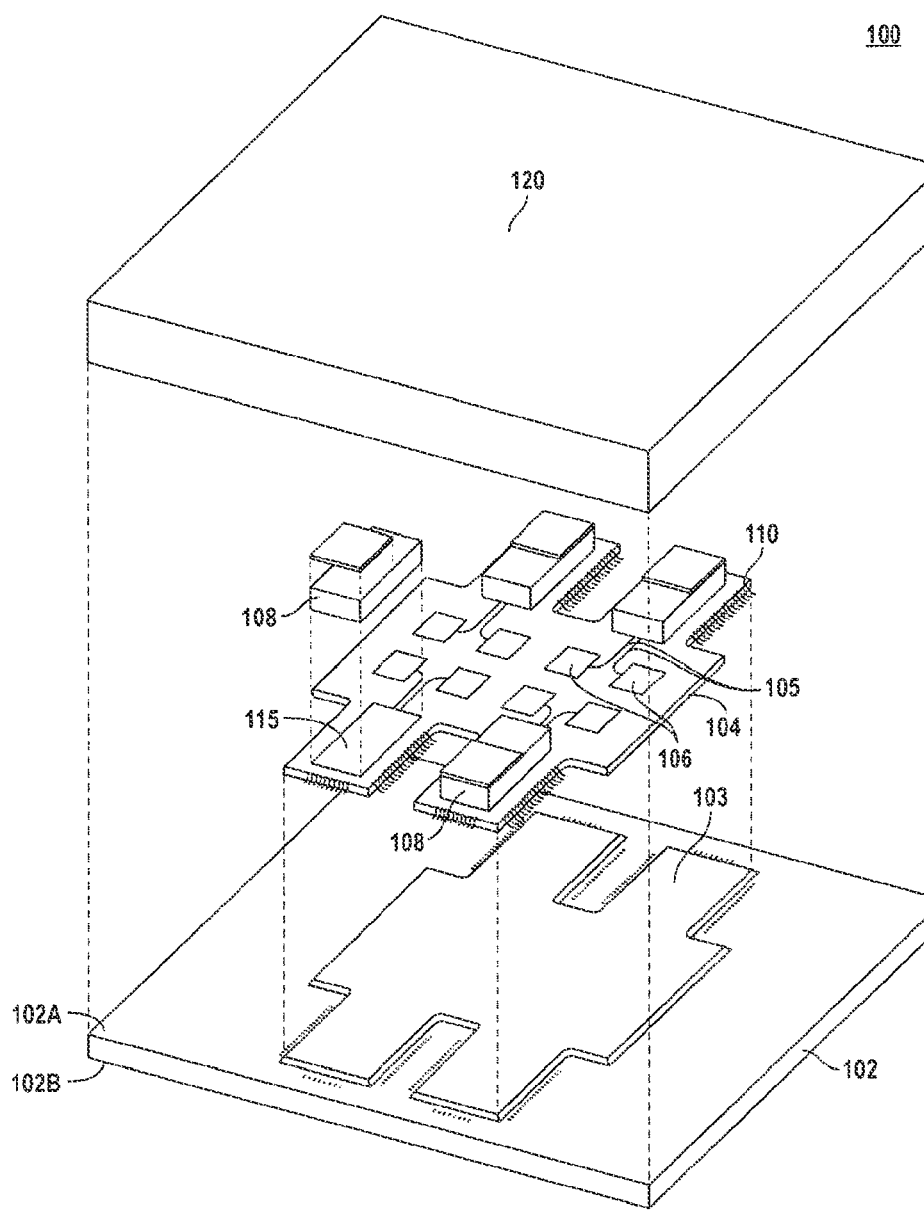
FIG. 4 illustrates a schematic of transceiver node package in accordance with an embodiment.

Each node is preferably housed in a package as shown in FIG. 4, although other designs and configurations for the node is contemplated. FIG. 4 illustrates an perspective view of the node package in accordance with an embodiment. As shown in the embodiment in FIG. 4, the node is made up of an integrated chip and antenna package 100 designed to be oriented as a substantially flat package and based on existing inter-connect standards such as land grid array (LGA), ball grid array (BGA) or other known package designs to allow the package 100 to be easily mounted to a printed circuit board. This allows the package 100 to be amenable to high volume manufacturing techniques using standard surface mount production techniques such as pick-in-place and thermal profile soldering.

In an embodiment, the package 100 is of standard size, such as 19 mm×19 mm with 289 pin, 1 mm pitch, ball standard BGA 17×17 grid. In another embodiment, the package 100 is a 19 mm×19 mm with 324 pin, 1 mm pitch, ball BGA 18×18 grid. In an embodiment, the package 100 is a 10 mm×10 mm with 81 pin, 1 mm pitch, ball standard BGA 9×9 grid. However, the size of the package 100 is dependent on the number of antennas and communication devices which are used in the package; thus other sized packages 100 are contemplated. In an embodiment, the package 100 utilizes 60 GHz millimeter wave antennas and enabled communication devices, although not limited thereto. Although the shown package 100 has four sets of antennas, the package may have a single transmitter and/or receiver antenna. Thus, it is contemplated that the package 100 may include any number and combination of transmitter and/or receiver antennas.

As shown in FIG. 4, the package 100 preferably includes a main substrate 102, a secondary substrate 104, and a lid 120. The main substrate in an embodiment is made of a typical printed circuit board material and has a top surface 102A as well as a bottom surface 102B. The main substrate 102 is shown to have a square shape in FIG. 4 although the substrate 102 may have any other desired shape. The bottom surface 102B is configured to support a BGA (e.g. grid of ball interconnects) to allow the main substrate 102 to be electrically coupled to a circuit board, such as a blade. The combination of the main substrate 102, antenna array on the secondary substrate 104 and lid 120 provide for a compact integrated antenna and chip package which has a standardized size and interconnection configuration to allow the package to be used on existing circuit boards (e.g. blades) without additional tooling or redesign.

As shown in FIG. 4, the secondary substrate 104 includes one or more seating areas 115 each of which is adapted to receive a communication device 108 thereon. Four seating areas are shown form part of the secondary substrate 104 to form a "H-shaped" configuration. Each communication device 108 is electrically coupled to one or more respective antennas 106, whereby the antenna 106 and the connecting terminals of the communication device 108 are substantially on the same plane. It should be noted that although four communication devices 108 are shown to be used in the chip package in FIG. 1A, any number of communication devices, including only one, can be used in the chip package 100 based on the desired application.

The communication device 108 operates as a radio (such as the receiver or transceiver 308-314 in FIG. 3) and provides power to as well as controls the magnitude and phase of radiation emitted from the antenna. It is contemplated that one or more receivers or transmitters may be configured on a single communication device 108. In an embodiment, the package 100 includes the switching circuit (302 in FIG. 3) within the communication device 108, although the switching circuit 302 may be in a separate component (e.g. IC or ASIC) within or outside the package 100. In an embodiment, the communication device 108 made of silicon germanium (SiGe) chip although gallium arsenide (GaAs); complimentary metal oxide semiconductor (CMOS); or other semiconductor chips are contemplated. The details of the workings of the communication device are known in the art and are not discussed herein.

In addition to the seating areas 115, the secondary substrate 104 includes a common area upon which the one or more antennas 106 are located. However it is contemplated that any other shape may be used in manufacturing and using the secondary substrate 104 without departing from the inventive embodiments described herein. In an embodiment, the secondary substrate 104 is made of a dielectric material such as quartz, sapphire, diamond and/or glass to allow the antenna assembly to operate properly. The secondary substrate 104 may be made of any other appropriate low-loss material which allows high radiation efficiencies from the antennas and other components operating in the millimeter wave frequency range. Extremely high bandwidth is possible at millimeter wavelengths due to the high carrier frequency (60, 120 or 240 GHz) and advanced modulation techniques. In an embodiment, spectral efficiencies on the order of 1 to 6 bits/sec/Hz are employed by the system.

The spacing of an antenna set 106 adjacent to one another on the substrate 104 is designed to create a phased array radiation pattern when activated and controlled by the communication devices 108. By controlling the phase reference signals to each communication device 108 in the package, the package allows coherent radiated energy produced by the antennas 106 to propagate through a radiation lens in the lid 120 or through the main substrate 102, as discussed in more detail below. In addition, although the antenna array is shown as having multiple antenna sets adjacent to one another on the substrate plane 104, two or more sets of antennas may be disposed on top of one another in vertical dimensions along with their respective communication device chips 108 to increase antenna gain and power specifications of the package. More details of the package 100 are discussed in U.S. patent application Ser. No. 12/070,281, filed Feb. 15, 2008, hereby incorporated by reference.

As shown in FIG. 4, the antennas 106 are preferably dipatch differential feed antennas which converge together via their feed lines 105 at a common feed point as is described in more detail in U.S. patent application Ser. No. 11/786,761, filed Apr. 11, 2007. However, it is contemplated that any other type of antenna may be used with the package 100.

As stated above, the communication device 108 operates as a radio (such as the receiver or transceiver 308-314 in FIG. 3) and provides power to as well as controls the magnitude and phase of radiation emitted from the antenna. It is contemplated that one or more receivers or transmitters may be configured on a single communication device 108. In an embodiment, the package 100 has MIMO-on-a-chip capability, whereby the package includes one or more antennas each coupled to respective transmitters and/or one or more antennas each coupled to respective receivers, whereby all antennas and transmitters/receivers are disposed on a single substrate. This allows multiple transmitters/receivers in a single chip package to respectively process the signals for each MIMO channel and thereby improve the package's ability to increase its spectral efficiency.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A wireless millimeter wave mesh network comprising:
   a first network communication device associated with a first housing, wherein the first network communication device is coupled to a communication network;
   a first stationary communication node coupled to the first network communication device and located at the first housing, the first communication node configured to emit millimeter wave electromagnetic radiation to wirelessly communicate data;
   a second network communication device associated with a second housing located separate and remote from the first housing, wherein the second network communication device is coupled to the communication network; and
   a second stationary communication node coupled to the second network communication device and located at the second housing, wherein the second communication node is configured to emit millimeter wave electromagnetic radiation to wirelessly communicate data with the first communication node of the first network communication device.

2. The network of claim 1 wherein the first communication node further comprises:
   a first substrate having a first surface and a second surface, the second surface configured to interface the chip package to a circuit board being made of a first dielectric material;
   a second substrate disposed on the first surface of the first substrate, the second substrate being made of a second dielectric material;
   a communication element disposed on the second substrate, wherein the communication element includes an antenna and a communication device coupled to the antenna;
   a lid coupled to the first substrate and configured to encapsulate the communication element, the lid having a lens configured to allow radiation from the antenna to be emitted therethrough.

3. The network of claim 2, wherein the communication element further comprises a plurality of transmitters coupled to respective transmitting antennas, wherein the transmitters and transmitting antennas are all disposed on the second substrate.

4. The network of claim 2, wherein the communication element further comprises a plurality of receivers coupled to respective receiving antennas, wherein the receivers and receiving antennas are all disposed on the second substrate.

5. The network of claim 1 further comprising a data source disposed on the first circuit board and coupled to the first communication node, wherein the data source provides at least operational information to the first communication node.

6. The network of claim 1 wherein the first communication node and the second communication node wirelessly communicate to perform a switching function between the first and second modules without using a central switch.

7. The network of claim 1 wherein the first communication node and the second communication node communicate using time division multiplexing access and frequency division multiplexing access.

8. The network of claim 1 further comprising an intermediate communication node having a transmitter antenna and a receiver antenna, wherein the intermediate communication node receives the communication from the first communication transmits the data packet to the second communication node.

9. A method for wirelessly communicating between a plurality of network communication devices in a communication network, the method comprising:
   sending a data packet from a first network communication device to a second network communication device, wherein the first network communication device is within a first housing and the second network communication device is within a second housing separate from the first housing, the first network communication device including a first stationary communication node coupled to a first stationary antenna and the second network communication device including a second stationary communication node coupled to a second stationary antenna, wherein the first antenna and the second antenna are configured to emit millimeter wave electromagnetic radiation to allow transfer of data packets with the one another.

10. The method of claim 9, further comprising identifying an operating parameter for the data packet, wherein the operating parameter at least includes an address of the destination node.

11. The method of claim 10, wherein the operating parameter further includes a frequency hopping sequence and a time counter for the frequency hopping sequence.

12. The method of claim 10, wherein the operating parameter includes information identifying a node other than the destination node which is capable of receiving the data packet.

13. The method of claim 9, wherein the first communication node operates a selected power setting and the second communication node operates a selected sensitivity setting to allow successful transmission of the data packet therebetween.

14. The method of claim 9, further comprising receiving the data packet at the second communication node, wherein the received data packet is transmitted to a data sink coupled to the second communication node.

15. The method of claim 9, wherein the first communication node autonomously selects and transmits to the second communication node without using a central switching module.

16. The method of claim 9, wherein the first communication node and second communication node communicate the data packet using MIMO technology.

* * * * *